US008762111B2

(12) United States Patent
Muller et al.

(10) Patent No.: US 8,762,111 B2
(45) Date of Patent: Jun. 24, 2014

(54) METHOD FOR INPUTTING A SPATIAL LAYOUT OF PRODUCTION DEVICES TO A COMPUTER-AIDED PLANNING PROGRAM AND FOR OPTIMIZING THE LATTER

(75) Inventors: Martin C. Muller, Munich (DE); Sanja Uzelac, Geiselbullach (DE)

(73) Assignee: Siemens Aktiengesellschaft, Munich (DE)

( * ) Notice: Subject to any disclaimer, the term of this patent is extended or adjusted under 35 U.S.C. 154(b) by 565 days.

(21) Appl. No.: 13/092,291

(22) Filed: Apr. 22, 2011

(65) Prior Publication Data

US 2011/0264416 A1 Oct. 27, 2011

(30) Foreign Application Priority Data

Apr. 23, 2010 (DE) .......................... 10 2010 018 634

(51) Int. Cl.
*G06F 17/50* (2006.01)
(52) U.S. Cl.
USPC .......................................................... 703/1
(58) Field of Classification Search
USPC .......................................................... 703/1
See application file for complete search history.

(56) References Cited

U.S. PATENT DOCUMENTS

| 4,700,317 | A | 10/1987 | Watanabe et al. | ........ | G06F 9/44 |
| 6,470,301 | B1 * | 10/2002 | Barral | ................ | 703/1 |
| 7,634,322 | B2 * | 12/2009 | Samudrala et al. | ............ | 700/17 |
| 7,724,250 | B2 * | 5/2010 | Ishii et al. | ..................... | 345/419 |
| 2002/0107674 | A1 | 8/2002 | Bascle et al. | ............. | G06F 3/00 |

FOREIGN PATENT DOCUMENTS

| DE | 102005011148 A1 | 9/2006 | ............ G05B 13/00 |
| EP | 0685804 A2 | 12/1995 | ............ G06F 17/50 |

OTHER PUBLICATIONS

Huang, George Q., Y. F. Zhang, and P. Y. Jiang. "RFID-based wireless manufacturing for real-time management of job shop WIP inventories." The International Journal of Advanced Manufacturing Technology 36.7-8 (2008): 752-764.*
J.E. Beasley, "An Exact Two-Dimensional Non-Guillotine Culling Tree Search Procedure," Operations Research, vol. 33, No. 1, Jan.-Feb. 1985 (16 pages), May 1982.
Glovia International, Firmenprospekt der Firma Fujitsu, Factory Planning, 2008 (2 pages).
International Search Report and Written Opinion for Application Number PCT/EP2011/054880 (10 pages), Jul. 6, 2011.
Zachmann, Gabriel, "Real-Time and Exact Collision Detection for Interactive Virtual Prototyping," Proceedings of the 1997 ASME Design Engineering Technical Conference, 10 pages, 1997.

* cited by examiner

*Primary Examiner* — Kamini S Shah
*Assistant Examiner* — Juan Ochoa
(74) *Attorney, Agent, or Firm* — King & Spalding L.L.P.

(57) ABSTRACT

In a factory planning method, provision is made for the models (15a) of the model layout to be placed on a substrate, with the result that the position of the models can be determined using digital image processing after the models have been placed. As a result, the real models (15a) can be used for clear factory planning, in which case collisions (33) on account of an area requirement (15b) resulting from particular specifications to be displayed by the planning program are and an optimized proposal to preferably also be output are provided for. This advantageously makes it possible to combine the intuitive factory planning method using real models with the factory planning method using planning programs, thus enabling interactive working with both planning methods.

20 Claims, 3 Drawing Sheets

METHOD FOR INPUTTING A SPATIAL LAYOUT OF PRODUCTION DEVICES TO A COMPUTER-AIDED PLANNING PROGRAM AND FOR OPTIMIZING THE LATTER

CROSS-REFERENCE TO RELATED APPLICATIONS

This application claims priority to DE Patent Application No. 10 2010 018 634.1 filed Apr. 23, 2010. The contents of which are incorporated herein by reference in its entirety.

TECHNICAL FIELD

The invention relates to a method for inputting a spatial layout of production devices, which together form a production plant, to a computer-aided planning program and for optimizing the latter. In the method, the production devices which may consist, for example, of machine tools for a product generate two-dimensional or three-dimensional models which are true to scale and match the originals at least in terms of their physical area requirement. Said models are used to produce a model layout of the production plant on a flat substrate. The model layout is then detected using a sensor, in which case an image sensor, for example a CCD camera, is preferably used. The position of the models is then calculated by the planning program on the basis of the data acquired by the sensor and is linked to data records of the production devices in the planning program. In this case, the models can be detected, for example, by means of suitable image processing with subsequent pattern comparison.

BACKGROUND

In the broader sense, a production plant is intended to be understood as meaning a structure which consists of at least two production devices. This can be used to mean, for example, a production cell which contains a plurality of machines. However, as a production plant, an entire factory hall or even an entire factory, for example, can also be represented as a model. In the broader sense, production devices should be understood as meaning all spatial units which are required for production. In the narrower sense, these include machines for machining products, but likewise devices for transporting the products between the different machines as well as other spatial devices which are required in the production plant. Other spatial devices may be understood as meaning, for example, offices for production managers, paths for employees, storage areas for material etc.

It is generally known practice per se to represent production plants, for example factory halls, as a model. Such models can support the powers of imagination of those involved in planning, in particular in the planning phase.

Computer-aided planning tools for factory planning, as are offered, for example, by the company Fujitsu under the trade name GLOVIA in a 2008 company brochure, are suitable as an alternative. These computer-aided planning tools require virtual three-dimensional models of the production devices and of the spatial conditions of the production plant to be input. The models produced in this manner can then be compiled in a virtual environment and a production sequence can be simulated in order to be able to draw conclusions on the functionality of the planned production plant.

Both real model layouts and computer-aided simulations of production plants can be used to carry out optimization processes which allow the production sequences as well as the space requirement and further aspects to be optimized before the production plant is constructed. In this case, real model layouts have the advantage that there is an intuitive interface for the factory planner. On the other hand, computer-aided planning programs have the advantage that simulation of the production sequence is easier, and further data can also be processed in addition to spatial data during modeling.

This is because, in order to be able to construct a simulation of the production plant in the planning program described above, the boundary conditions for the respective application to be planned must be known. These include the spatial conditions of the production plant, which may already be present (optimization task) or has yet to be constructed (planning task), and the properties of the production devices used. The data may already be present in databases, with the result that linking to the planning program can be carried out in a comparatively simple manner. However, data which are not yet available must be input to the planning program, thus resulting in effort for the factory planner.

In order to ease the effort involved in inputting the data to the planning system, US 2002/0107674 A1 proposes that the models of the production devices may be provided, for example, with two-dimensional markers which are suitable for identifying the individual models. An optical recognition system, for example, can use these markers to recognize the identity of the individual production devices. It is also possible to detect the orientation of said devices. The model itself can also be used as a marker using a relatively large amount of computational effort, in which case said marker must be recognized using suitable optical recognition methods.

U.S. Pat. No. 4,700,317 describes a program for planning the layout of factories, for example, in which, in addition to the actual area requirement of the production devices, a relatively large, relevant area requirement can also be taken into account. This relevant area requirement is automatically identified by the program and is taken into account when generating a proposal for the layout. After the proposal which takes into account the relevant area requirement of the production devices has been developed, the proposal is output on a suitable output device. The area requirement of the individual production devices is displayed there, in which case production devices whose relevant area requirement is relatively large are at a correspondingly relatively long distance from adjacent production devices. The manner in which the consideration of a relevant area requirement of individual production devices is included in detail in the proposed planning result cannot be gathered from the output.

SUMMARY

According to various embodiments, a method for inputting the interaction of production devices of a production plant to a computer-aided planning program can be specified, the input method intending to enable the following optimization steps in a comparatively efficient manner.

According to an embodiment, a method for inputting a spatial layout of production devices, which together form a production plant, to a computer-aided planning program, may comprise: the production devices using real, two-dimensional or three-dimensional models which are true to scale at least in terms of their physical area requirement and are used to form a model layout of the production plant on a flat substrate, the model layout being detected using a sensor, in particular an image sensor, the position of the models being calculated by the planning program on the basis of the data detected by the sensor and being linked to data records of the production devices in the planning program, wherein the data records of the production devices have data relating to the relevant area requirement of the production devices which goes beyond the physical area requirement, overlaps of the respective relevant area requirement of adjacent production devices are determined, and although the overlaps are allowed, they are displayed using an output device.

According to a further embodiment, the data records of the production devices may contain further specifications for the production devices, in particular standards and guidelines. According to a further embodiment, further data records can be provided in the planning program, which data records relate to the relationships between the production devices, in particular material flows and transport paths. According to a further embodiment, additional data records relating to the structural conditions of the production plant can be provided in the planning program. According to a further embodiment, the planning program may calculate a proposed correction for avoiding the overlaps which have been determined, and the proposed correction can be displayed using the output device. According to a further embodiment, the planning program may calculate a proposed correction for avoiding unused empty areas, and the proposed correction can be displayed using the output device. According to a further embodiment, the output device may display the overlaps and/or proposed corrections on the flat substrate. According to a further embodiment, the expected costs and/or the area requirement can be calculated from the established planning variant and/or from the proposed corrections. According to a further embodiment, the data records of the production devices and/or the further data records relating to the relationships between the production devices can be supplemented with individual preferences which restrict the wealth of variations of the proposed corrections. According to a further embodiment, the models can be provided with machine-readable carriers for identification identifiers, and the carriers can be optically readable and can be fitted to the models in such a manner that they are optically accessible from a viewing direction of the substrate from above after the models have been placed on the substrate. According to a further embodiment, a temporal sequence of digital images can be created from the model layout using the image sensor, changes in the positions of the carriers can be determined by comparing the images, and the updated positions of the carriers can be linked to data records of the production devices in the planning program using the identification identifiers.

BRIEF DESCRIPTION OF THE DRAWINGS

Further details of the invention are described below using the drawing. Identical or corresponding demerits of the drawing are each provided with the same reference symbols in the figures and are explained repeatedly only insofar as differences result between the individual figures. In the drawing.

DETAILED DESCRIPTION

Figure 1:
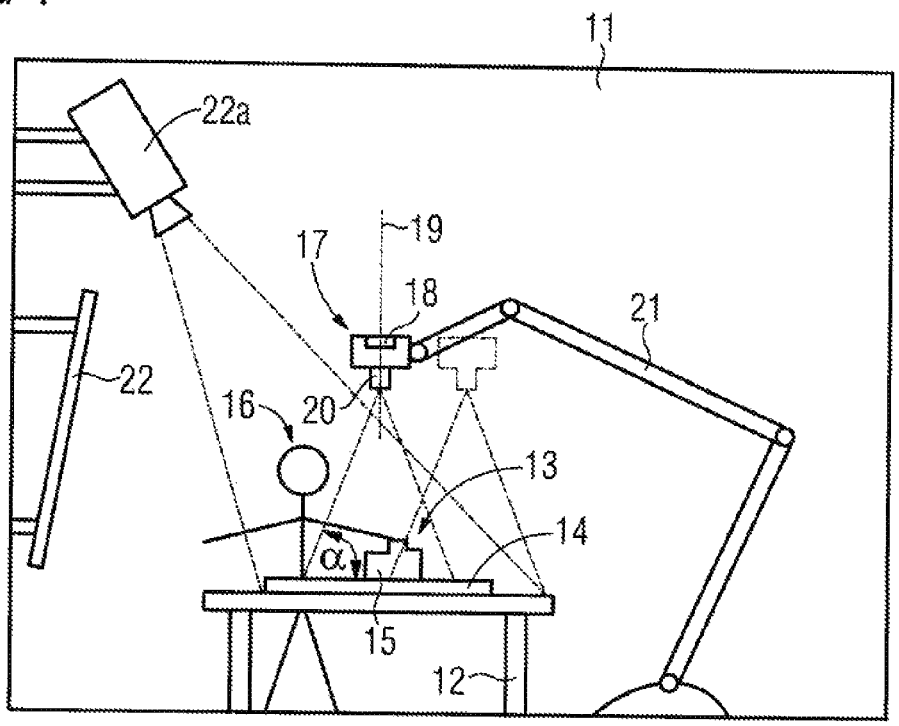
FIG. 1 diagrammatically shows the use of an exemplary embodiment of the method in a room.

According to various embodiments, the data records of the production devices may have data relating to the relevant area requirement of the production devices, the relevant area requirement going beyond the physical area requirement. A relevant area requirement of particular production devices can exceed the actual (spatial) area requirement of these production devices for different reasons. For example, accessibility by personnel must be ensured, with the result that a certain distance must be maintained between two production devices. In addition, the workpiece to be machined may also have a space requirement which must be taken into account when setting up the production devices. This is because it must be ensured that the workpiece can be provided by a providing system, for example. Other reasons are also conceivable, which is why the actual area requirement of the production device is larger (for example maintenance flaps).

The method according to various embodiments also provides for overlaps of the respective relevant area requirement of adjacent production devices to be determined. These overlaps are then displayed using an output device. These overlaps can be displayed in different ways. For example, the relevant area requirement around the production devices can be represented by a suitably colored area. Overlaps can then be detected as intersections between adjacent actual area requirement markings. However, overlaps can also be indicated by virtue of the output device displaying, in the region of the overlaps, a hazard symbol or arrows as proposals for how overlaps can be avoided.

The method according to various embodiments therefore makes it possible to correct defective factory planning processes in the three-dimensional model in a comparatively effective manner. The intuitive input by the factory planners by providing the models produces, as output, as it were, feedback from a computer-aided factory planning system which can immediately determine collisions between the relevant area requirement of individual production devices by taking into account suitable data records. The factory planning process can therefore be understood as meaning a dialog between the human planners at the planning table and the factory planning program (also referred to as a planning program for short) which uses the output device. This advantageously makes it possible to produce a large rationalization effect with a simultaneously intuitive input method.

One refinement of the method provides for the data records of the production devices to contain further specifications for the production devices, in particular standards and guidelines. This advantageously makes it possible for the factory planning program to take into account not only collisions with respect to the area requirement but also specifications which cannot be represented per se in the division of the factory hall. For example, it would be possible to take into account the fact that an annoying odor occurs in a production device for painting workpieces, with the result that production devices which are operated by people are not in the vicinity of this production device which is carrying out the painting process. Standards and guidelines which are taken into account as further specifications in the data records could be, for example, safety distances in the case of hazardous materials or the like. The rationality of the method according to various embodiments is advantageously increased further by taking into account this additional information.

According to a further embodiments, further data records may be provided in the planning program, which data records relate to the relationships between the production devices, in particular material flows and transport paths. The further data records which are also always specifically referred to as "further data records" below are therefore data which are not directly linked to the production devices and are therefore stored in the further data records. Furthermore, there are additional data records which are specifically referred to as "additional data records" below and relate to the structural conditions of the production plant (supporting pillars etc., height of the production hall, assembly cranes, doors, windows etc.). With regard to the material flows and transport paths in the further data records, it should be noted, for example, that paths for transporting material and for the personnel to reach the individual production devices must be provided in the production plant. Relationships which are predefined, for example, by unimpeded material flow of the workpiece or auxiliary materials may also be stored in the further data records. In the case of assembly line production, for example, it could be necessary to line up the production devices in a particular order on the assembly line. However, these relationships can be better stored in further data records which are not permanently tied to a particular production device. As a result of the further data records, the factory planning program can therefore advantageously react in an even more efficient manner to the planning actions carried out by the factory planner at the planning table. The additional data records also make it possible to efficiently take into account the spatial conditions of the production plant. Transport paths should lead to a door of the factory hall, for example.

It is particularly advantageous if the planning program calculates a proposed correction for avoiding the overlaps which have been determined, and if the proposed correction is displayed using the output device. The overlaps are also displayed indirectly with the proposed correction since the underlying determination of overlaps can be inferred by the planning program from the changes which have been made. In this case, algorithms for optimizing the planning factory concept are used, which algorithms are known per se and have already been implemented in available factory planning programs. Optimization problems of the type mentioned are known as so-called two-dimensional packing and can be solved by a number of approaches, for example by a simple variant of the so-called ILP formulation (ILP stands for Integer Linear Programming) proposed in Beasley J E (1985) "An Exact Two-dimensional Non-guillotine Cutting Tree Search Procedure", Operations Research 33(1): 49-64. In this case, only the distance between the corrected position and the measured position of each individual object must be used as weight in the target function. This formulation can then be solved practically by commercially available software, for example "CPLEX" from the company IBM ILOG or "XPRESS" from the company FICO (formerly Fair Isaac, formerly Dash). In this case, the computation times depend greatly on the number of production devices. If this number exceeds a certain limit, for example 100, local search heuristics can also be used instead, for example evolutionary algorithms, so-called simulated annealing or else a so-called Opt-Lets framework which is described in DE 10 2005 011 148 A1.

It is also advantageous if the proposed correction is displayed using the output device, with the result that the intuitively working factory planner is provided with feedback with a proposed improvement. The factory planner can follow the proposed improvement or can possibly implement another proposed improvement on the planning table in order to see whether the planning program does not output any further collisions after analyzing the alternative proposal. The increase in rationality when generating proposed corrections therefore advantageously lies in acceleration of the process since the intuitively working factory planner can follow the proposal or is inspired with respect to an alternative proposal.

In the same manner, the planning program can also advantageously calculate a proposed correction for avoiding unused empty areas and can display this proposed correction using the output device. Just as collisions have to be prevented, a competitive planning concept can be created only when the area of the production plant is optimally used. In this context, unused empty areas which can be detected and analyzed in the same way as collisions (cf. the statements made with regard to the collisions) should also be avoided.

As described in US 2002/0107674 A1 mentioned at the outset, the models can be automatically detected, for example, by means of image processing by identifying the two-dimensional or three-dimensional models. In order to be able to detect the models more easily in an automated manner, provision may be made for the models to be provided with machine-readable carriers for identification identifiers. In the broader sense, all physical devices which can provide machine-readable information are intended to be understood as meaning carriers for information. This means that a possibility for being machine-read by an appropriate reader must be respectively provided for this carrier. For example, the carrier can store the information magnetically, in which case, in order to read this information, a magnetic sensor must be brought into the vicinity thereof as a reader. Another possibility is to use so-called RFID tags which are activated by a suitable reader and emit the information stored in the carrier via a radio or infrared interface, for example. Another possibility is to use acoustic information. For this purpose, the carrier must emit an acoustic signal which can be picked up by an acoustic sensor.

In addition to the identification identifiers, provision may be additionally made for the carrier to have position identifiers which contain coordinates of the respective position of the relevant carrier on the relevant model. This is because the identification identifier can only be used to identify the model via the carrier, with the result that data relating to the model are provided by the reading-in process and can be fed into a planning program. However, if the position of the model on the plan is also intended to be determined by means of the image, it is advantageous to determine only the position of the information carrier for this purpose. This is possible with comparatively little computational effort since the carrier has only limited dimensions. If the position of the information carrier on the associated model is known, the position of the model on the substrate can also be inferred using the determined position of the information carrier. This advantageously makes it possible to easily map a real model layout in a planning program.

It is advantageous if the carriers are optically readable and are optically accessible from a viewing direction of the substrate from above. Optical accessibility is required since the models are placed on the substrate in order to create the model layout. The substrate thus forms a model of the floor of the production plant, in which case the carriers can be best read optically, as it were, from a bird's-eye view without the models concealing each other. In this case, a vertical viewing direction is particularly advantageous. It goes without saying that viewing directions which differ therefrom can also be selected as long as it is ensured that the models do not conceal each other. A comparatively large angle of 20° to 90°, for example, can be selected for the viewing direction, in particular when using two-dimensional models, that is to say small plates which represent only the outlines of the production devices on the substrate, for example. If three-dimensional models are used, an angle of 60° to 90° is advantageous for the viewing direction. The vertical viewing angle corresponds to an angle of 90°. The identification identifiers may consist of one-dimensional or two-dimensional barcodes. The code 39, the code 93 or the code 128 may be mentioned as examples of a one-dimensional barcode. The UR code, the DATAMATRIX code or the AZTEC code may be mentioned, for example, as representatives of two-dimensional barcodes.

It should also be taken into account, in particular if a camera containing an image sensor and a lens is used as the device for reading the carriers, that a vertical viewing direction is ensured only in the center of the recorded image. Viewing directions of the substrate from above which differ from the vertical with respect to the substrate inevitably result at the image edges.

Therefore, it is advantageous if a plurality of overlapping images of the model layout are recorded. This makes it possible to keep the viewing angle low in the images by using appropriate optics with longer focal lengths and to compile the multiplicity of images to form a single image by evaluating the overlaps. This makes it possible to relate the models of the production devices to one another in the different images.

It is particularly advantageous if the images overlap to such an extent that each carrier is depicted in at least two images. Errors when determining the position of the respective model on account of the perspective distortion in the images can then be corrected by comparing at least two relevant images. Relevant images are those images which depict the relevant carrier. There must be at least two relevant images. According to various embodiments, the perspective distortion should be understood as meaning the fact that an image can be recorded only in the optical axis of the lens precisely from the predefined viewing direction, for example the vertical viewing direction. The objects in the edge regions of the recorded image inevitably have a viewing direction which differs from this particular viewing direction and must be taken into account when determining the position of the relevant carrier on the substrate. This position error can be determined by comparing the position of the relevant carrier in another image, in which case the distance between the image axes of the two images is taken into account here.

According to an embodiment of the method is obtained if a temporal sequence of digital images is created from the model layout using the image sensor. This temporal sequence produces, as it were, a film which represents the intuitive planning process by adjusting the models. The intervals between the creation of the individual images can be freely selected in this case, the individual images being intended to make it possible to compare the different planning states. This makes it possible to determine changes in the positions of the carriers by comparing the images. The updated positions of the carriers can then be linked to data records of the production devices in the planning program via the identification identifiers and the virtual model of the production plant used in the planning program can be respectively adapted to the real model.

The planning program can be advantageously used to drive an output device on which the changes in the position of the production devices linked to the carriers are displayed. This has the advantage that the real model can be used, as early as during the intuitive planning phase, to determine what effects the proposed (adjusted) changes have on the virtual model of the production plant contained in the planning program. This also makes it possible to check statements which can be created only using the planning program. Conventional planning programs can be used in this case. Both conventional CAD applications and other planning programs such as those which support, for example, a transport matrix/Sankey diagram representation, arrangement optimization according to Schmigalla or a cost-benefit analysis are conceivable.

It is particularly advantageous if the proposed corrections to the planning program which have already been mentioned are displayed on the flat substrate, that is to say that substrate on which the models are moved by the factory planner. This advantageously allows direct, intuitively quickly comprehensible coupling between the planning proposal from the factory planners, as represented by the models, and the proposed corrections to the planning program. For example, the planning program can display the outlines of the models at the position envisaged by the planning program proposal. The factory planners can then decide whether to correct the models according to the proposal, that is to say to bring them in line therewith, or to try another planning variant. The overlaps can also be directly displayed on the flat substrate in the same way. A projector which projects the planning proposal onto the flat substrate from above can be used as the output device, for example. An alternative is to design the flat substrate as a flat screen, with the result that the models are moved on the screen surface. The screen can then be simultaneously used to output the alternative proposal calculated by the planning program.

The method according to various embodiments is carried out as follows when using machine-readable carriers. The models are provided with machine-readable carriers for identification identifiers. The models are used to form a model layout of the production system on a flat substrate. At least one digital image of this model layout is created from a viewing direction of the substrate from above using an image sensor. The identification identifiers of the models are detected by machine. The positions of the models belonging to the carriers are determined in the digital image. The positions of the models are finally linked to data records of the production devices in the planning program via the identification identifiers.

Provision may be advantageously made for position identifiers to be provided on the carriers in addition to the identification identifiers, which position identifiers contain the coordinates of the respective position of the carriers on the models. It is then possible to calculate the position of the models represented by the carriers on the substrate by determining the position of the carriers while taking into account the position identifiers. In particular, the following procedure is adopted here. The position of the carrier in the image is determined. In this case, a plurality of images may possibly be evaluated in the described manner in order to determine the position of the carrier without any doubt. The position identifiers are then superimposed on the position of the carrier, with the result that the position of the entire model on the substrate can be inferred on the basis of the position of the carrier. This conclusion is thus drawn by means of a calculation by the planning program which is provided with the necessary information in the form of identification identifiers and position identifiers.

An alternative possibility is for the data records of the production devices in the planning program to already contain the coordinates of the respective position of the carriers on the models. In this case, there is no need for position identifiers on the carriers since these data have already been stored in the planning program. Said data may be retrieved by evaluating the identification identifiers of the relevant model and, after the model has been identified, retrieving the coordinates of the position of the carrier from the data record of the production device. When these are available, the position of the models represented by the carriers on the substrate can be calculated by determining the position of the carriers while taking into account the position of the carriers on the models.

According to a further embodiments, the expected costs and/or the area requirement to be calculated can be provided from the established planning variant and/or from the proposed corrections. The planning program can advantageously be used for this purpose, with the result that decisive aspects can be determined in real time from a planning proposal, namely which costs will be associated with this planning proposal and how large the area requirement is overall. Additional criteria which assist the factory planners with their decisions are produced in this manner.

A further embodiment also provides for the data records of the production devices and/or the further data records relating to the relationship between the production devices to be supplemented with individual preferences which limit the wealth of variations of the proposed corrections. This makes it possible to take into account individual specifications which thus influence the entire planning process and make it easier to find a result which takes these preferences into account. The planning method can therefore be advantageously rationalized further.

FIG. 1 illustrates a room 11 in which the planning method according to various embodiments is intended to be carried out. A table 12 on which a model layout 13 is diagrammatically illustrated is situated in the center of the room. Said model layout consists of a substrate 14 on which a model 15 of a machine as a production device has been set up by way of example. The substrate represents the outline of a production plant in the form of a factory hall in a manner which is not illustrated.

A first important method step in the planning method according to various embodiments involves a factory planner 16 manually placing the model 15 at its correct location. Further models (not illustrated) and further people (likewise not illustrated) may be involved in this planning phase.

During this planning phase, a digital camera 17 uses an image sensor 18 to take pictures (images) of the model layout 13 at regular intervals of time. This is effected from above, precisely in the vertical direction in the exemplary embodiment, that is to say following gravity. This produces an image axis 19 which is perpendicular to the substrate 14. However, on account of the focal length of a lens 20 of the digital camera 17, a viewing direction α which is approximately 75° with respect to the substrate 14 results for the models at the edge of the recorded image.

In order to be able to accurately determine the position of the model despite the perspective distortion on account of different viewing directions inside the image, the digital camera 17 is used to record at least one further image from the position illustrated using dash-dotted lines. In order to move the camera, the latter is fastened to a stand 21. Alternatively (not illustrated), the camera may also be held by the factory planner 16 and may be manually oriented; there is no need for a stand in this case.

The image data from the digital camera 17 are processed by a planning program in a second planning step in a manner not illustrated and are output in the room 11 using an output device 22 which is on the wall and is in the form of a screen. This makes it possible for the factory planner 16 to interactively act on the model layout 13, in which case modifications to the planning result represented by the model layout 13 are immediately displayed on the output device 22, with the result that the results intuitively achieved on the model layout 13 can be simultaneously subjected to analysis by the planning program. Last-minute corrections are therefore possible, thus making it possible to efficiently optimize the planning result.

The output device 22 is formed by a flat screen. However, the output device 22a may also be used as an alternative to said output device. This output device 22a is a projector which can be used to project screen contents onto the surface of the table 12 obliquely from above. In this case, with a representation which is true to scale, planning alternatives from the planning program can be directly correlated with the models 15 on the table 12, with the result that the factory planner 16 can directly compare his variant with the variant presented by the planning program. As a result of the projection direction obliquely from above, the image produced by the output device 22a on the surface of the table must be equalized, but this is possible without any problems by means of conventional optics in the output device 22a. The oblique projection direction is required so that the camera 18 does not become visible as a shadow in the projected image.

Alternatively (not illustrated in FIG. 1), it is also possible to dispense with a permanently installed camera and to create the images with a camera in a freehand manner. In this case, the projector may also be mounted above the table with a vertical orientation.

Figure 2:
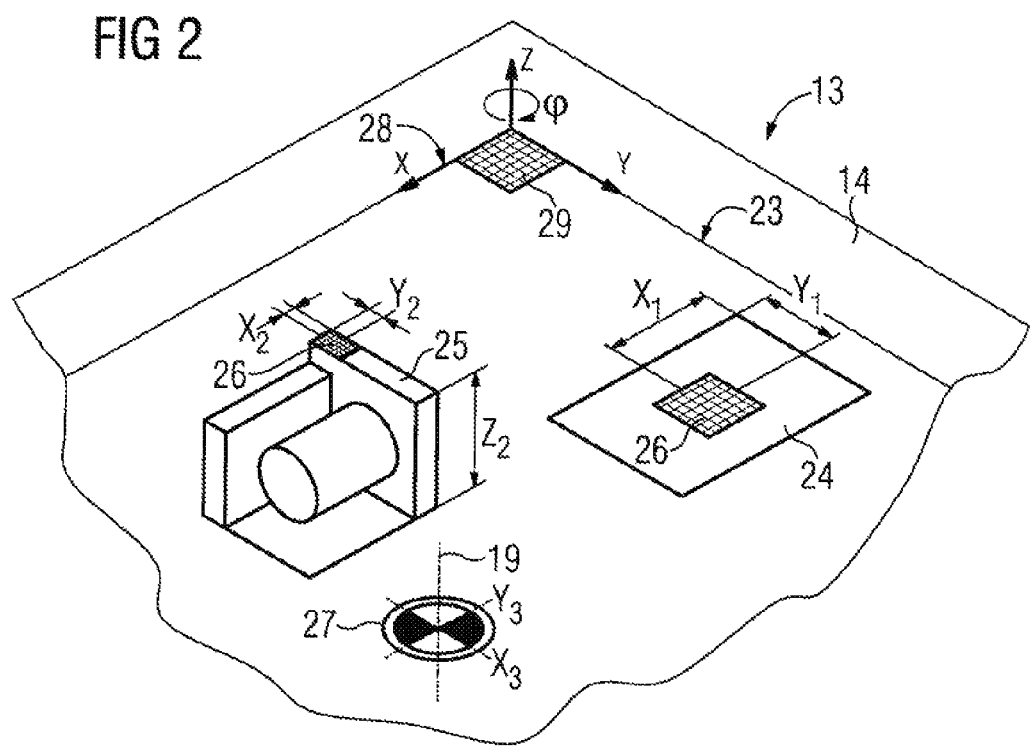
FIG. 2 shows a spatial illustration of a section of an exemplary embodiment of the model layout.

FIG. 2 illustrates a representative section of the model layout 13 according to FIG. 1. The outline 23 of the factory hall to be planned can be seen on the substrate 14. A two-dimensional model 24 and a three-dimensional model 25 of production devices can also be seen on the substrate. These may be, for example, machines, production cells or else required open areas such as storage zones, a buffer zone or paths. The models 24, 25 are placed at particular locations on the substrate and therefore represent a particular planning state in the factory planning process.

The models 24, 25 are provided with carriers 26 for information. In the exemplary embodiment according to FIG. 2, they are carriers for optical information in the form of a two-dimensional barcode. The information comprises an identification identifier for the respective model, which can be uniquely assigned in this manner to a production device to be planned, which is stored in the planning program together with additional information such as resultant area requirement, accessibility, safety regulations, etc. The carriers also contain information relating to their position on the respective model. In the exemplary embodiment according to FIG. 2, this position information is expressed, for example, in a Cartesian coordinate system x-y-z, as depicted in FIG. 2. Since the models can also be rotated on the substrate, there is also a coordinate φ which expresses the angle of rotation of the relative coordinate systems (not illustrated), which are associated with the models, with respect to a stationary coordinate system 28 of the substrate around the vertical z axis.

The model 24 is a two-dimensional model, with the result that only one $x_1$ coordinate and one $y_1$ coordinate are stored in this case. The model 25 is described by the coordinates $x_2$, $y_2$, $z_2$ as a three-dimensional model. In this case, the coordinates each indicate the position of the center point of the respective carrier 26 with respect to the rest of the model.

The angular coordinate φ cannot be stored on the carrier. It must rather be determined by taking into account the angular position of the model 24, 25 on the substrate. For this purpose, the carrier may have orientation information whose angular position is obtained by subjecting the recorded image to image processing.

A mark 27 having the coordinates $x_3$, $y_3$ with respect to the stationary coordinate system 28 is also provided on the substrate. This mark is used to orient the digital camera 17, with the result that the position of the image axis 19 with respect to the stationary coordinate system 28 is known. This facilitates the spatial placement of the models in the planning program.

Finally, a further carrier 29 which indicates the position of the stationary coordinate system 28 is also provided on the substrate.

The illustration of the position identifiers is only by way of example and can also be effected in another manner. In particular, the coordinates indicated may also be directly input to the planning program, with the result that there is no need to store said coordinates on the carriers. In this case, the position information is linked to the models via the identification identifier in the planning program.

Figure 3:
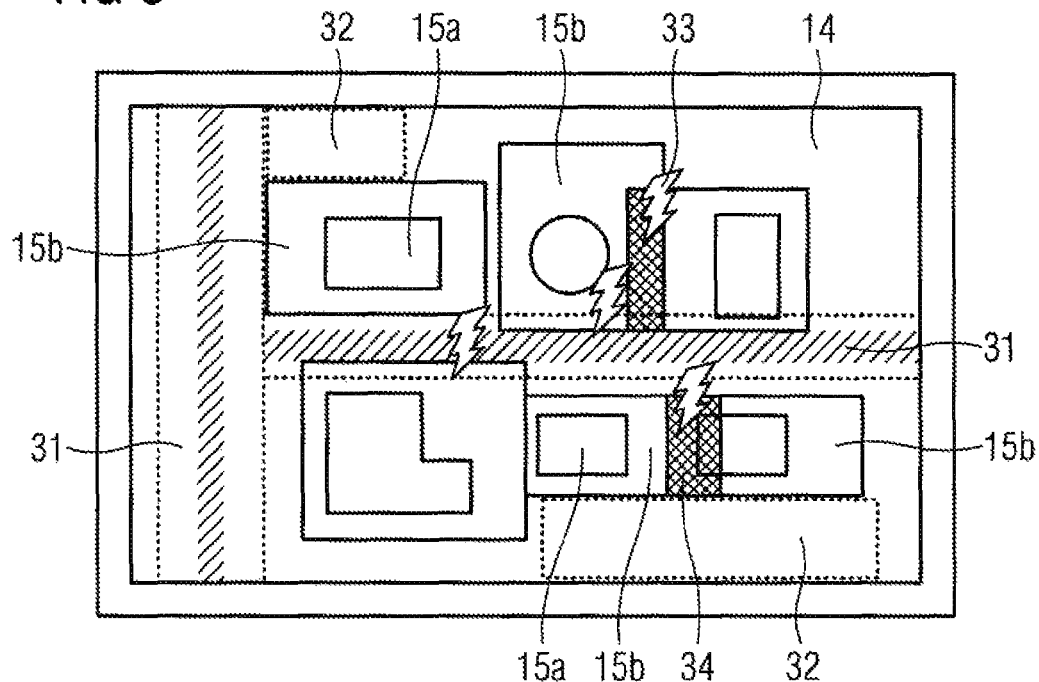
FIGS. 3 and 4 show displays on the output device when using an exemplary embodiment of the method before and after the arrangement of the models has been corrected on account of overlaps.
Figure 4:
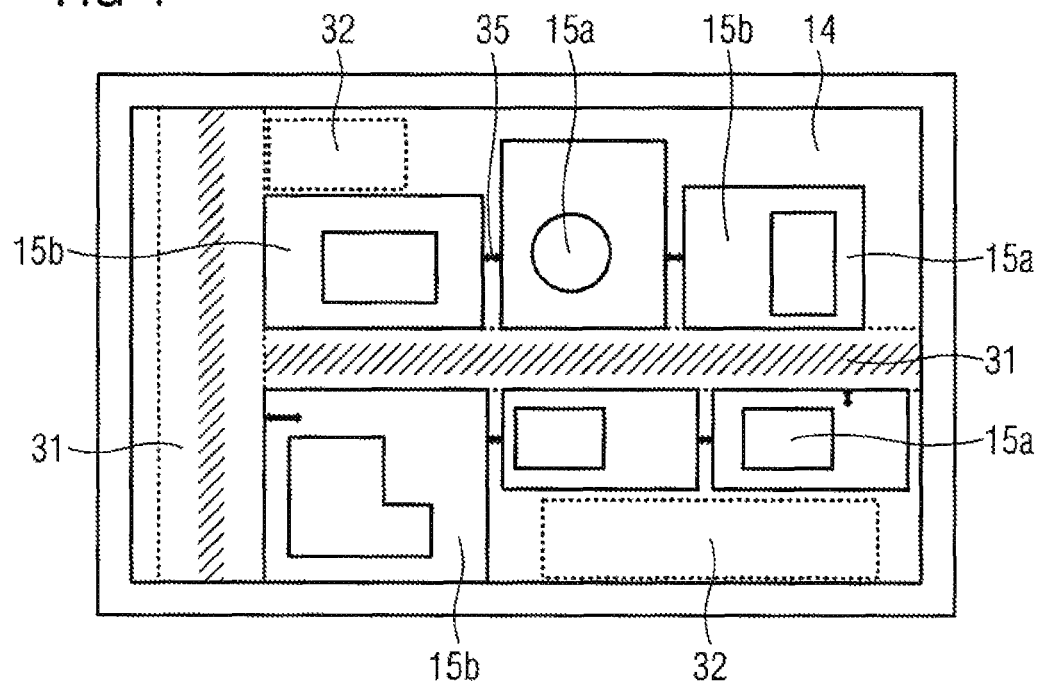
Figure 5:
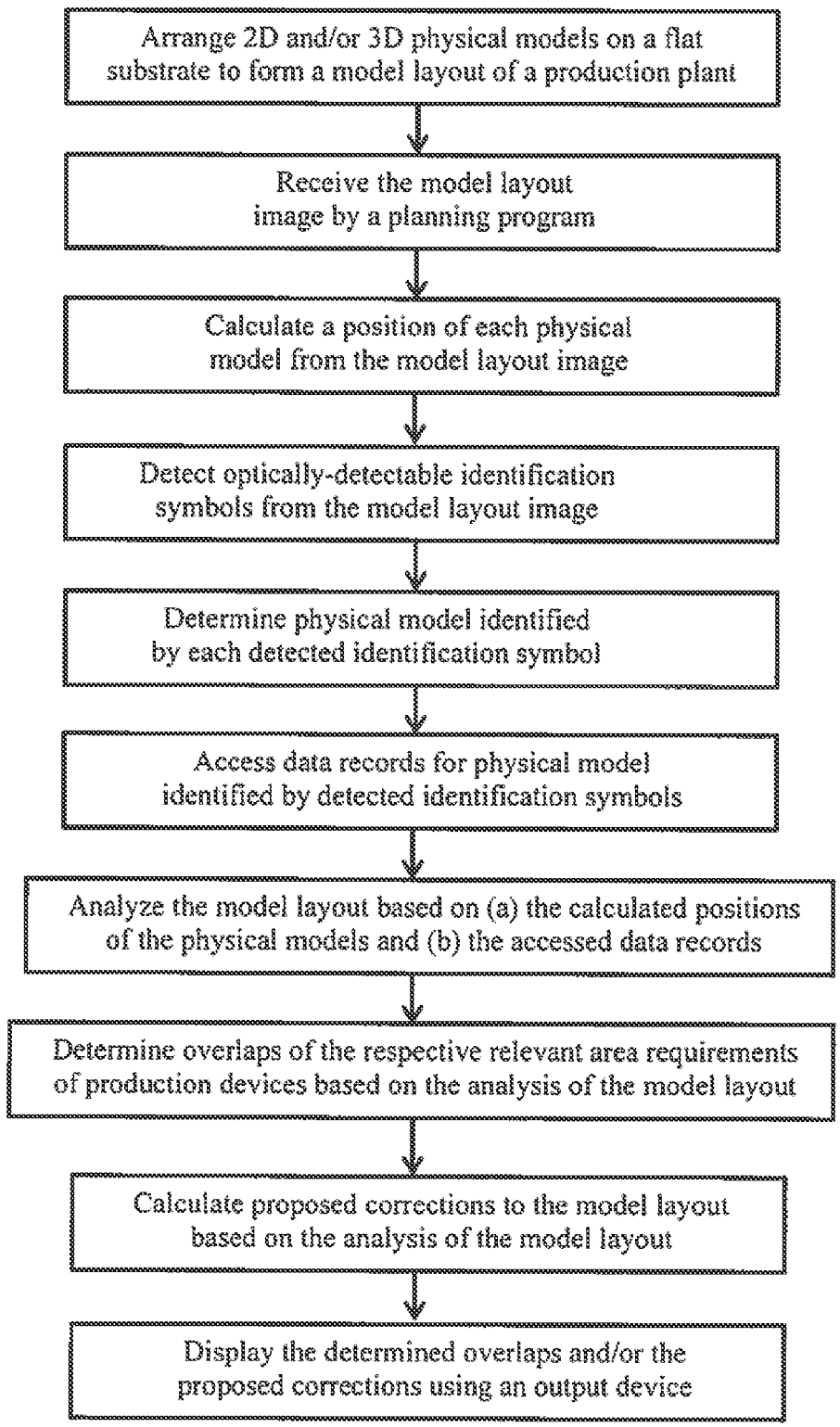
FIG. 5 shows an example method of analyzing a spatial layout of production devices, which together form a production plant, using a computer-aided planning program.

FIGS. 3 and 4 illustrate, by way of example, two outputs on the output device 22 or 22a, as may be generated by a suitable planning program. If these are output by the output device 22a, this is effected on the flat substrate 14, the real models having been omitted in FIGS. 3 and 4. Said models are rather directly represented as outlines of the production devices 15a, in which case the real (physical) area requirement of the latter can be seen in the output. In addition, each production device 15a is assigned a relevant area requirement 15b which is defined by the specifications for the respective production device 15a. The output from the planning program also shows transport paths 31 which imperatively have to be kept clear. Material providing areas 32 which are used as buffer zones for the intermediate storage of production goods (raw materials, workpieces) are also provided.

The output according to FIG. 3 is first of all an output which is intended to display only collisions. This is indicated by a hazard symbol 33 in the form of a lightning bolt. Intersections 34 between the regions of the relevant area requirement 15b of respective adjacent production devices 15a are also produced. This makes it possible for the factory planner 16 to quickly see the need for a change.

According to FIG. 4, the planning program may also make a proposed correction. As can easily be seen in FIG. 4, the dangers 33 according to FIG. 3 have been eliminated by moving the production devices 15a. The different directions of movement are indicated by the planning program in the output by means of small double-headed arrows 35 so that the correction can be understood by the factory planner 16.

On the basis of the output according to FIG. 4, the planning program can calculate the total area required for the concept without any great problems (on account of the representation which is true to scale). The total area is composed of the circulation area consisting of the transport paths 31, the machine use area consisting of the relevant area requirement 15b of the production devices 15a, the logistics area consisting of the material providing areas 32, and the remaining area. Characteristic numbers which make it possible to assess the planning alternative can be derived therefrom.

What is claimed is:

1. A method for analyzing a spatial layout of production devices, which together form a production plant, using a computer-aided planning program, the method comprising:
    arranging a plurality of physical models on a flat substrate to form a model layout of the production plant, the physical models including at least one of two-dimensional models and three-dimensional models of a plurality of production devices, which each physical model is true to scale in terms of physical area requirements of the production device represented by that physical model, and wherein at least one of the physical models includes an optically-detectable identification symbol that identifies that physical model,
    capturing an image of the model layout by a sensor or an image sensor,
    the planning program receiving the model layout image, and based on the model layout image:
        calculating a position of each physical model included in the model layout image,
        detecting at least one optically-detectable identification symbol in the model layout image,
        for each detecting identification symbol, determining the physical model identified by that identification symbol and automatically accessing from storage a data record for the production device represented by that physical model,
    the planning program analyzing the model layout based at least on (a) the calculated position of each physical model and (b) the data records accessed for each physical model having a detected identification symbol, wherein the analysis includes determining overlaps of the respective relevant area requirements of production devices represented by adjacent physical models, and
    the planning program generating and displaying with an output device an image of the analyzed model layout, which indicates the determined overlaps.

2. The method according to claim 1, wherein the data records of respective production devices contain specifications for the respective production devices.

3. The method according to claim 1, wherein the data records of respective production devices contain standards and guidelines.

4. The method according to claim 1, wherein further data records are provided in the planning program, which data records relate to relationships between the production devices.

5. The method according to claim 4, wherein the further data records are related to material flows and transport paths.

6. The method according to claim 1, wherein additional data records relating to structural conditions of the production plant are provided in the planning program.

7. The method according to claim 1, wherein the planning program calculates a proposed correction for avoiding the overlaps which have been determined, and
    the proposed correction is displayed using the output device.

8. The method according to claim 5, wherein the planning program calculates a proposed correction for avoiding unused empty areas, and
    the proposed correction is displayed using the output device.

9. The method according to claim 1, wherein the planning program calculates a proposed correction to the model layout, and wherein the output device displays at least one of the overlaps and proposed corrections on the flat substrate.

10. The method according to claim 1, further comprising the planning program calculating proposed corrections to the model layout and calculating at least one of expected costs and area requirements for at least one of the model layout and the proposed corrections.

11. The method according to claim 1, wherein:
    the planning program stores further data records relating to relationships between the production devices,
    the planning program calculates proposed corrections to the model layout, and
    at least one of the data records of the production devices and the further data records relating to relationships between the production devices include individual preferences which restrict a number of variations of the proposed corrections.

12. The method according to claim 1, wherein the optically-detectable identification symbols are optically readable and are fitted to the respective physical models in such a manner that they are optically accessible from a viewing direction of the substrate from above after the respective physical models have been placed on the substrate.

13. The method according to claim 10, wherein a temporal sequence of digital images is created from the model layout using the image sensor, changes in the positions of the optically-detectable identification symbols are determined by comparing the digital images, and the changed positions of the carriers are linked to data records of the production devices in the planning program using identification identifiers associated with respective identification symbols.

14. A system for inputting a spatial layout of production devices, which together form a production plant, to a computer-aided planning program, comprising:

a plurality of physical models on a flat substrate to form a model layout of the production plant, the physical models including at least one of two-dimensional models and three-dimensional models of a plurality of production devices, which each physical model is true to scale in terms of physical area requirements of the production device represented by that physical model, and wherein at least one of the physical models includes an optically-detectable identification symbol that identifies that physical model, a sensor for capturing an image of an arrangement of the plurality of physical models defining a model layout, a processor for executing a planning program to receive the model layout image, and based on the model layout image:

calculate a position of each physical model included in the model layout image, detect at least one optically-detectable identification symbol in the model layout image, for each detecting identification symbol, determine the physical model identified by that identification symbol and automatically accessing from storage a data record for the production device represented by that physical model, analyze the model layout based at least on (a) the calculated position of each physical model and (b) the data records accessed for each physical model having a detected identification symbol, and based on the analysis, determine overlaps of the respective relevant area requirement of adjacent production devices, and an output device for displaying an image of the model layout analyzed by the planning program, which image indicates the determined overlaps.

15. The system as claimed in claim 14, wherein the data records of respective production devices contain specifications for respective production devices, in particular standards and guidelines.

16. The system as claimed in claim 14, wherein further data records are provided in the planning program, which data records relate to relationships between the production devices.

17. The system as claimed in claim 14, wherein additional data records relating to the structural conditions of the production plant are provided in the planning program.

18. The system as claimed in claim 14, wherein the planning program calculates a proposed correction for avoiding the overlaps which have been determined, and the proposed correction is displayed using the output device.

19. The system as claimed in claim 18, wherein the planning program calculates a proposed correction for avoiding unused empty areas, and the proposed correction is displayed using the output device.

20. The system as claimed in claim 14, wherein the output device displays at least one of the overlaps and proposed corrections on the flat substrate.

* * * * *